United States Patent
Iyer et al.

(10) Patent No.: US 10,903,102 B2
(45) Date of Patent: Jan. 26, 2021

(54) METHODS FOR PURGING A SUBSTRATE CARRIER AT A FACTORY INTERFACE

(71) Applicant: Applied Materials, Inc., Santa Clara, CA (US)

(72) Inventors: Subramaniam V. Iyer, Maharashtra (IN); Dharma Ratnam Srichurnam, Karnataka (IN); Devendrappa Holeyannavar, Bangalore (IN); Douglas MacLeod, Los Altos, CA (US); Kenneth Carpenter, Leander, TX (US); Naveen Kumar, Bengaluru (IN); Vivek R. Rao, Bengaluru (IN); Patrick Pannese, Mountain View, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/667,025

(22) Filed: Oct. 29, 2019

(65) Prior Publication Data
US 2020/0066560 A1 Feb. 27, 2020

Related U.S. Application Data

(62) Division of application No. 14/920,785, filed on Oct. 22, 2015, now Pat. No. 10,510,570.
(Continued)

(51) Int. Cl.
*H01L 21/673* (2006.01)
*H01L 21/67* (2006.01)
*H01L 21/677* (2006.01)

(52) U.S. Cl.
CPC .. *H01L 21/67383* (2013.01); *H01L 21/67017* (2013.01); *H01L 21/67389* (2013.01); *H01L 21/67772* (2013.01)

(58) Field of Classification Search
CPC ............ H01L 21/673; H01L 21/67383; H01L 21/67389; H01L 21/67017; H01L 21/67772; H01L 21/677
See application file for complete search history.

(56) References Cited

U.S. PATENT DOCUMENTS 6,899,145 B2   5/2005  Aggarwal
7,654,291 B2 * 2/2010  Miyajima ......... H01L 21/67772
                                                    141/63
(Continued)

FOREIGN PATENT DOCUMENTS

TW           200735256 A    9/2007

OTHER PUBLICATIONS

Taiwan Search Report of Taiwan Application No. 104134921 dated Dec. 6, 2018.
(Continued)

*Primary Examiner* — Nicolas A Arnett
(74) *Attorney, Agent, or Firm* — Lowenstein Sandler LLP

(57) ABSTRACT

A method of purging a substrate carrier at a load port includes: opening a door of a substrate carrier that is delivered to a load port; spraying the substrate carrier with a gas flow responsive to the opening the door; mapping substrates within the substrate carrier to generate a substrate map; determining a process purge state based on the substrate map; and activating one or more inter-substrate nozzle arrays and one or more curtain nozzle arrays using a predefined spray status configuration for the process purge state.

20 Claims, 8 Drawing Sheets

Related U.S. Application Data

(60) Provisional application No. 62/068,617, filed on Oct. 24, 2014.

(56) References Cited

U.S. PATENT DOCUMENTS

| | | |
|---|---|---|
| 7,726,353 B2 | 6/2010 | Okabe |
| 8,302,637 B2 * | 11/2012 | Okabe ............... H01L 21/67772 |
| | | 141/98 |
| 10,510,570 B2 * | 12/2019 | Iyer ................... H01L 21/67389 |
| 2003/0031537 A1 | 2/2003 | Tokunaga |
| 2006/0272169 A1 | 12/2006 | Miyajima |
| 2009/0035099 A1 | 2/2009 | Okabe et al. |
| 2009/0035100 A1 | 2/2009 | Okabe et al. |
| 2009/0169342 A1 | 7/2009 | Yoshimura et al. |
| 2012/0060972 A1 | 3/2012 | Okabe |
| 2013/0042945 A1 | 2/2013 | Emoto et al. |
| 2014/0157722 A1 | 6/2014 | Iwamoto et al. |
| 2015/0040950 A1 | 2/2015 | Kaise et al. |
| 2015/0214078 A1 | 7/2015 | Iwamoto et al. |

OTHER PUBLICATIONS

International Preliminary Report on Patentability of International Application No. PCT/US2015/057005 dated May 4, 2017.
International Search Report and Written Opinion of International Application No. PCT/US2015/057005 dated Jan. 20, 2016.

* cited by examiner

METHODS FOR PURGING A SUBSTRATE CARRIER AT A FACTORY INTERFACE

RELATED APPLICATIONS

This application claims the benefit under 35 U.S.C. § 120 of U.S. patent application Ser. No. 14/920,785, filed Oct. 22, 2015, titled "System, Apparatus, and Methods for Purging a Substrate Carrier at a Factory Interview," which claims the benefit under 35 U.S.C. § 119(e) of U.S. Provisional Patent Application No. 62/068,617, filed Oct. 24, 2014, titled "Systems, Apparatus, and Methods for Purging a Substrate Carrier At a Factory Interface," both of which are hereby incorporated by this reference herein in their entirety.

FIELD

The present disclosure relates to processing substrate carriers, and more specifically to methods for purging a substrate carrier at a factory interface or equipment front end module.

BACKGROUND

As the semiconductor manufacturing industry transitions to smaller and smaller technologies such as 22 nm, 14 nm, and so on, oxidation defects and particulate matter become a more critical problem to solve. Numerous studies conducted by manufacturers and other researchers have noted that maintaining an inert environment in the substrate carriers significantly reduces defects caused by moisture and oxidation. Existing solutions however require manufactures to replace the load ports and substrate carriers used in the electronic device manufacturing facilities. These components are expensive to replace and may not be compatible with other systems in the manufacturing facilities. Thus, what is needed are systems, methods, and apparatus that allow manufacturers to maintain an inert environment in substrate carriers being processed at a factory interface that does not require new load ports or new substrate carriers.

SUMMARY

In some embodiments, the present disclosure provides a method of purging a substrate carrier at a load port. The method includes opening a door of a substrate carrier that is delivered to a load port. The method may further include spraying the substrate carrier with a gas flow responsive to the opening the door. The method may further include mapping substrates within the substrate carrier to generate a substrate map. The method may further include determining a process purge state based on the substrate map, and activating one or more inter-substrate nozzle arrays and one or more curtain nozzle arrays using a predefined spray status configuration for the process purge state.

In some other embodiments, the present disclosure provides a method of purging a substrate carrier at a load port. The method includes opening a door of a substrate carrier that is delivered to a load port. The method may further include spraying the substrate carrier with a gas flow responsive to the opening the door. The method may further include determining a process purge state depending on a number and location of substrates positioned within one or more zones of the substrate carrier. The method may further include activating one or more inter-substrate nozzle arrays and one or more curtain nozzle arrays using a predefined spray status configuration for the process purge state.

In yet other embodiments, the present disclosure provides a method of purging a substrate carrier at a load port. The method includes opening a door of a substrate carrier that is delivered to a load port. The method may further include spraying the substrate carrier with a gas flow while the door is opened. The method may further include mapping substrates within one or more zones of the substrate carrier to generate a substrate map. The method may further include determining a process purge state based on the substrate map and based on one of presence or absence of an end effector of a factory interface robot within the substrate carrier. The method may further include activating one or more inter-substrate nozzle arrays and one or more curtain nozzle arrays using a predefined spray status configuration for the process purge state.

Still other features, aspects, and advantages of the present disclosure will become more fully apparent from the following detailed description, the appended claims, and the accompanying drawings by illustrating a number of exemplary embodiments and implementations, including the best mode contemplated for carrying out the present disclosure. Embodiments of the present disclosure may also be capable of other and different applications, and its several details may be modified in various respects, all without departing from the spirit and scope of the present disclosure. Accordingly, the drawings and descriptions are to be regarded as illustrative in nature, and not as restrictive. The drawings are not necessarily drawn to scale. The description is intended to cover all modifications, equivalents, and alternatives falling within the spirit and scope of the claims.

DETAILED DESCRIPTION

Embodiments of the present disclosure provide methods for purging a substrate carrier at a factory interface. The methods ensure that a substrate carrier environment (e.g., the inside of a front-opening unified pod (FOUP)) is purged with an inert gas such as nitrogen or argon to mitigate the effects of oxidation, moisture, and particle contamination, and to mitigate risks of other potential defect causing phenomenon such as out gassing wafers, etc. Embodiments of the present disclosure provide a field retrofit-able factory interface (FI)/equipment front end module (eFEM) kit that allows for purging of a substrate carrier with nitrogen (N2) or any other practicable inert gas such as argon when the substrate carrier is being processed on a tool. A universal front purge FI/eFEM kit according to embodiments of the present disclosure can include two vertically disposed inter-substrate purge nozzle arrays (positioned on the sides of the FI/eFEM door opening) and one curtain nozzle array (positioned next to one of the inter-substrate purge nozzle arrays on the side of the FI/eFEM door opening). The combination of the gas flows from the nozzle arrays is controlled so as to achieve an optimum purge of the substrate carrier. The novel kit is configured to work with all substrate carriers and automatic door opener (ADO) configurations.

The kit is further configured to be mounted on the FI frame/panels/robot track or on the datum plate. The purging assembly (e.g., the nozzle arrays and frame) can be stationary or moveable based on performance requirements and space constraints. The FI/eFEM control system can be configured to be used to control the purging operation of the kit. Performance of the purging operation can be dependent on (e.g., gated by) the FI safety interlocks, load port status, and robot motion. The kit helps improve the associated tool's yield by providing an inert environment inside a substrate carrier and thereby reduces defects from particulate matter.

The universal compatibility of the kit with all ADO and substrate carrier types makes it a more commercially feasible option for upgrading Fis/eFEMs than replacement of substrate carriers and load ports. The FI controls can be configured to provide precise control over the timing and flow rate of the inert gas. These controls can be completely integrated into the FI control software and safety systems. In some embodiments, the flow of the gases can be adjusted dynamically and continuously in response to the number and position of substrates in the substrate carrier at any given time.

Figure 1:
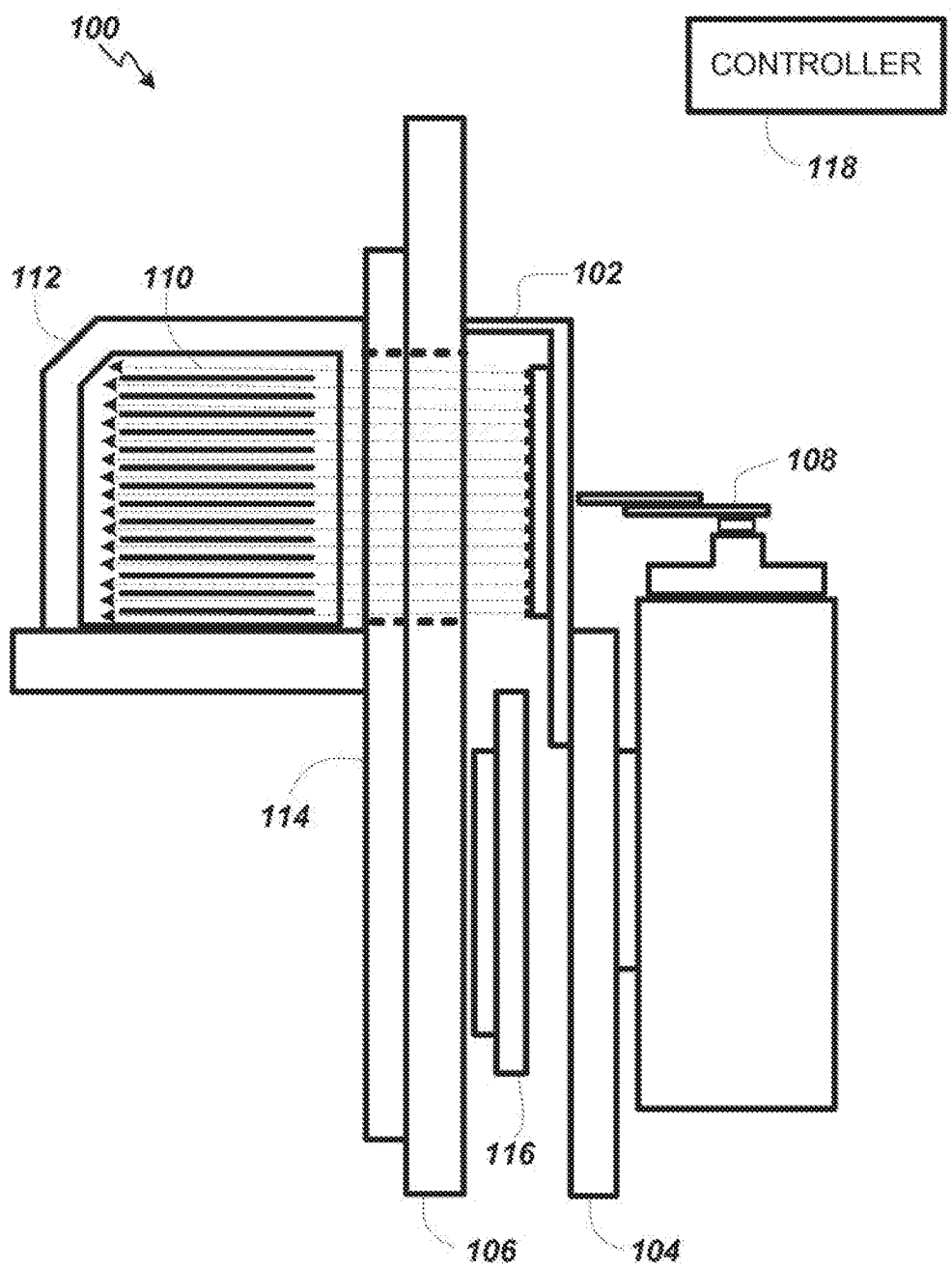
FIG. 1 is a schematic diagram depicting an example substrate carrier purge system according to embodiments of the present disclosure.

Turning now to FIG. 1, an example embodiment of substrate carrier purge system 100 for an FI is depicted. The system 100 includes a substrate carrier purge kit 102 that is adapted to be mounted on a FI robot track 104 and, in some embodiments, the FI frame 106. The FI robot track 104 provides a rail, gantry, frame, or stage for precise lateral movement of the base of the FI robot 108 to allow the FI robot 108 to access the various load ports of the FI. In embodiments of the system 100 without an FI robot track 104 (e.g., a system 100 the includes an FI robot than can reach multiple load ports without having to have its base moved laterally), the substrate carrier purge kit 102 can be mounted to the FI frame 106, FI panels and/or on a datum plate of the FI. As shown, the substrate carrier purge kit 102 is configured to direct multiple gas streams 110 or flows (represented as dashed arrows in FIG. 1) into a substrate carrier 112 loaded on a load port 114 of the FI when the door 116 has been opened. The system 100 operates under control of controller 118 which can be operatively coupled to the various components, including the substrate carrier purge kit 102, via wired or wireless communications network(s).

Figure 2:
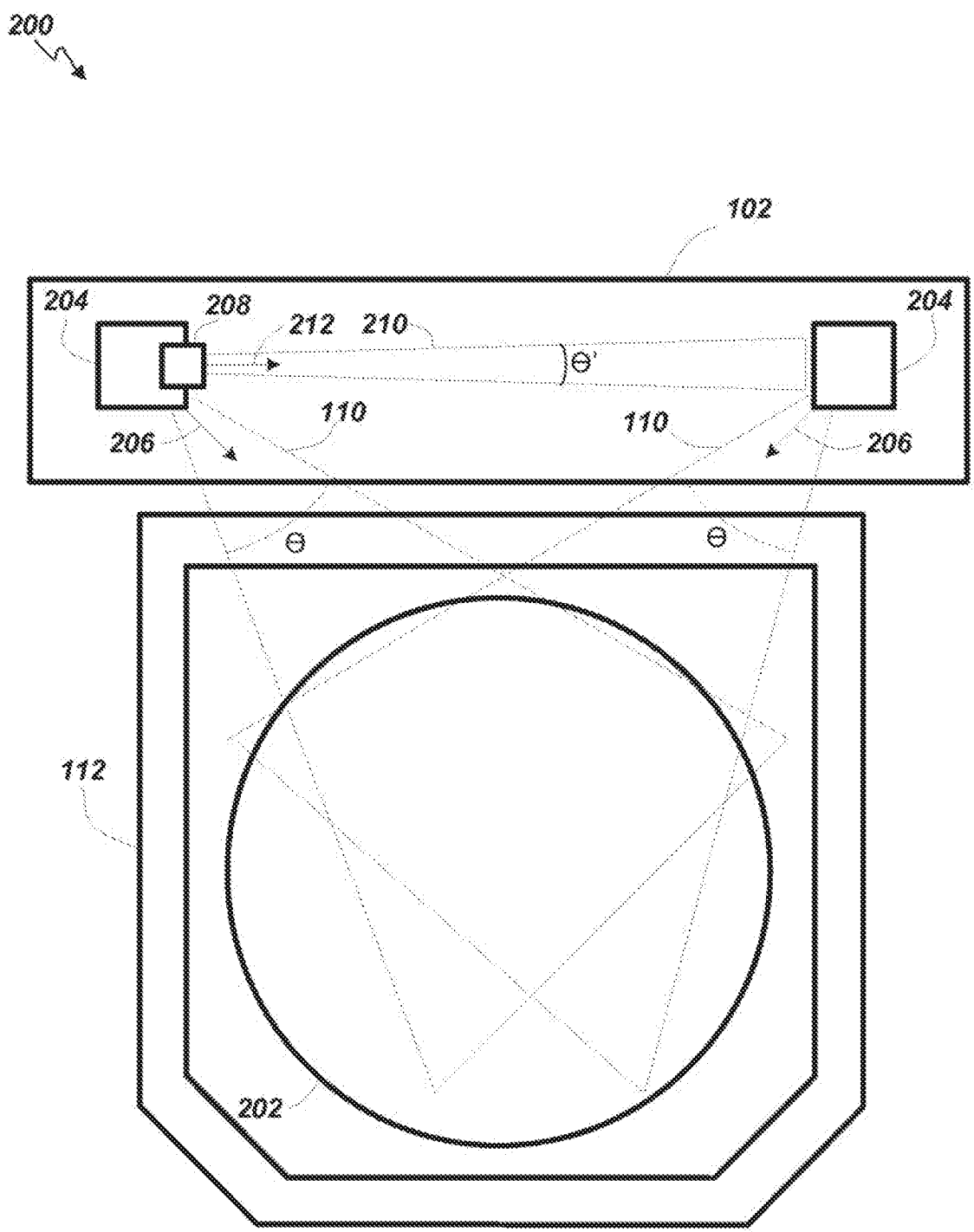
FIG. 2 is a schematic diagram depicting an example gas spray pattern of a substrate carrier purge system according to embodiments of the present disclosure.

FIG. 2 depicts a top view 200 of the system 100 that illustrates the expanding flow direction of the gas streams 110 (represented as dashed triangles in FIG. 2) toward substrates 202 in the carrier 112 in more detail. Inter-substrate nozzle arrays 204 within the substrate carrier purge kit 102 are aimed to flow gas over the major surfaces of the substrates 202. In some embodiments, the inter-substrate nozzle arrays 204 are aimed at an angle of approximately 45 degrees relative to the sides of the substrate carrier 112 (as indicated by arrows 206). In some embodiments the aiming angle of the inter-substrate nozzle arrays 204 (i.e., arrow 206) can be adjusted to aim the gas streams 110 at any desired direction (e.g., at the center point of the substrates 202) or angle it from directly into the substrate carrier (zero degrees) to perpendicular to the substrate sides (90 degrees). In some embodiments, the inter-substrate nozzle arrays 204 can be configured to oscillate (e.g., sweep back and forth over a range of angles, for example, zero to 90 degrees) or the angle can be changed based on the number and/or location of substrates 202 currently in the carrier 112 and/or to achieve a desired gas flow pattern. The nozzles of the inter-substrate nozzle arrays 204 are adapted to cause the gas streams 110 to expand with an angle 8 of between approximately zero degrees and approximately 120 degrees. In some embodiments, the angle 8 can be changed over time based on the number and/or location of substrates 202 currently in the carrier 112 and/or to achieve a desired gas flow pattern. Thus, in some embodiments, adjustable and/or aim-able nozzles can be used in the inter-substrate nozzle arrays 204.

FIG. 2 also depicts an example of a curtain nozzle array 208 disposed adjacent to one of the inter-substrate nozzle arrays 204. In some embodiments, the curtain nozzle array 208 has the same general structure as the inter-substrate nozzle arrays 204 but can include nozzles configured to generate a narrower, continuous, even, and consistent plane of gas. The curtain nozzle array 208 is configured to direct a plane or sheet of gas laterally (e.g., approximately parallel to the opening of the substrate carrier 112) across the opening of the substrate carrier 112 to form a gas curtain 210 aimed in the direction indicated by arrow 212 with an expansion angle 8'. In some embodiments the aiming angle of the curtain nozzle array 208 (i.e., arrow 212) can be adjusted to aim the gas curtain 210 in any desired direction (e.g., across the opening of the substrate carrier 112 (zero degrees)) or angle it from into the substrate carrier (−45 degrees) to away from to the substrate carrier (+45 degrees). In some embodiments, the expansion angle 8' of the gas curtain 210 flow can be between approximately zero degrees and approximately 120 degrees. The gas curtain 210 from the curtain nozzle array 208 effectively blocks any particles, moisture, or other gases that may be in the FI from entering the substrate carrier 112. In some embodiments, the curtain nozzle array 208 can be aimed away from the substrate carrier 112 at a small angle (e.g., less than 15 degrees from the plane of the carrier opening) to draw gas away from the carrier 112 and create a lower pressure area in front of the carrier 112, further reducing the chances of particles, moisture, or other gases that may be in the FI from entering the substrate carrier 112.

In some embodiments, the curtain nozzle array 208 can be disposed horizontally relative to the inter-substrate nozzle arrays 204 and above the substrate carrier opening aimed downward. In other words, the curtain nozzle array 208 can be position across the top of the substrate carrier purge kit 102 to direct a sheet of gas down across the opening of the substrate carrier 112. In yet other embodiments, the curtain nozzle array 208 can be positioned below the substrate carrier opening to direct a sheet of gas upward across the opening of the substrate carrier 112.

In some embodiments, both the inter-substrate nozzle arrays 204 and the curtain nozzle array 208 can include adjustable nozzles that can be dynamically adjusted during operation to change nozzle exit velocity, spray angle, expansion angle, flow pattern, oscillation rate, nozzle shape and size, etc.

In some embodiments, the gas flow rates and gas flow patterns can be adjusted to optimally reduce particles, moisture, or other gases from entering the carrier 112. For example, to both maintain a slight positive pressure (e.g., approximately 0.005 ATM) in the carrier 112 relative to the air pressure in the FI and to create a laminar flowing, swirl pattern that moves air from the back of the carrier 112 out the center of the carrier opening, gas can be flowed into the carrier 112 from the inter-substrate nozzle arrays 204 at specified rates and angles. For example, in some embodiments using a standard 25-slot substrate carrier loaded with 25 substrates 202, optimal results (e.g., minimized $O_2$ concentration within the carrier 112) can be achieved by spraying N2 into the carrier 112 at a 45 degree angle relative to the sides of the carrier 112 and at a rate of approximately 60 SLM from one side of the inter-substrate nozzle arrays 204 and approximately 30 SLM from the other side, while the curtain nozzle array 208 sprays gas at a rate of approximately 75 SLM.

Figure 3:
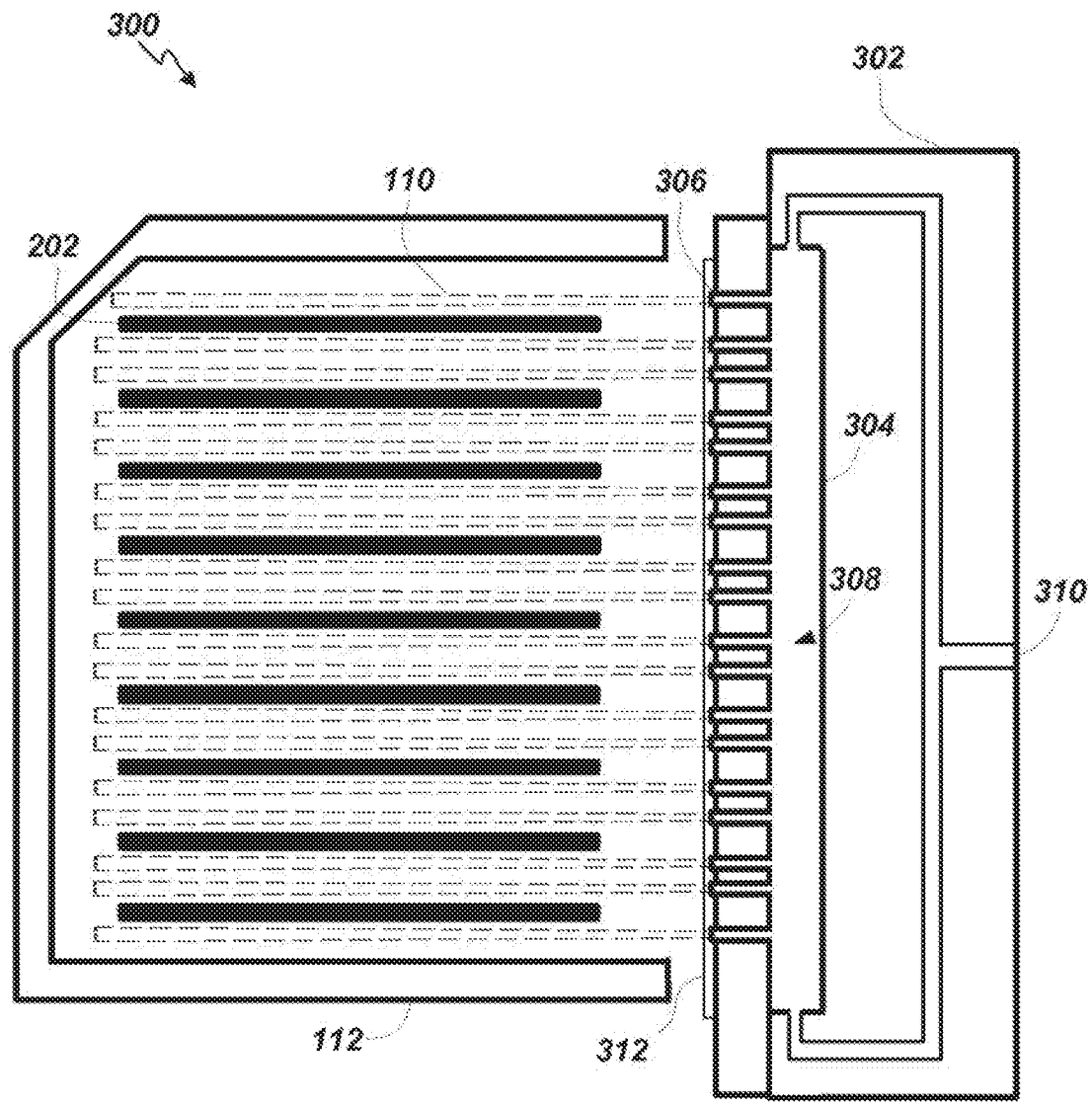
FIG. 3 is a schematic diagram depicting an example nozzle array of a substrate carrier purge system according to embodiments of the present disclosure.

Turning now to FIG. 3, a side view 300 of the system 100 that illustrates the flow direction of the gas streams 110 (represented as dashed triangles in FIG. 2) from the inter-substrate nozzle arrays 204 into the carrier 112 and between the substrates 202 in more detail. In some embodiments, the nozzle body 302 of the inter-substrate nozzle arrays 204 (and the curtain nozzle array 208) is configured to hold a removable/replaceable nozzle head 304 that includes a plurality of nozzles 306. The number of nozzles 306 can be a function of the size of the substrate carrier 112 being used. For example, a nozzle head 304 with 50 nozzles 306 can be used with a substrate carrier 112 configured to hold up to 25 substrates 202. In this configuration, a pair of nozzles 306 can be disposed to spray gas at the top and bottom of each substrate 202. For a substrate carrier 112 adapted to hold up to 13 substrates, a nozzle head 304 with 26 nozzles can be used.

When inserted into the nozzle body 302, a plenum 308 within the nozzle head 304 becomes in fluid communication with a gas supply channel 310 via ports at either or both ends of the nozzle head 304. In some embodiments, the number and arrangement of the nozzles 306 can be different in different nozzle heads 304 and thus, by replacing the nozzle head 304, different configurations of nozzles can be achieved. In addition to the nozzles 306, the shape of the plenum 308 can be different for different nozzle heads 304. In some embodiments, the plenum 308 can include an adjustable bellows (not shown) that can change the shape of the plenum 308 (e.g., the relative distances between the back wall of the plenum 308 and the various nozzles 306) to alter the relative pressure/amount of gas going to different nozzles 306. The bellows can be controlled by system software running on the controller 118.

In some embodiments, a nozzle orifice plate 312 is disposed in front of the nozzles 306 to provide control over individual nozzles. For example, the nozzle orifice plate 312 can include a plurality of sets of regularly spaced orifices of varying size and shape disposed to correspond with the number and position of the nozzles 306. Thus, by moving the nozzle orifice plate 312 between different sets of orifices, various characteristics of the gas spray pattern can be adjusted. In some embodiments, the position of the nozzle orifice plate 312 is controlled by system software running on the controller 118. The position of the nozzle orifice plate 312 can be indexed to a series of notches in the plate 312 that allow a sealed stepper motor (not shown) to both change and track the plate's position.

The removable nozzle head 304 allows interchange of different nozzles in the field to alter the gas flow characteristics such as nozzle exit velocity, spray angle, and direction of the flow into the substrate carrier 112. The same design philosophy is applied to the curtain nozzle array 208. The curtain nozzle heads are also interchangeable to also allow interchange of different nozzles in the field to alter the flow characteristics such as nozzle exit velocity, spray angle, and direction of the flow across the substrate carrier opening. For example, a nozzle head for a curtain nozzle array 208 can include nozzles that are angled away from the substrate carrier opening to allow the purge gas (e.g., ionized or non-ionized) to dislodge any particles that may be on the incoming/outgoing substrate (or end effector) into an enclosed mini environment in front of the carrier and thereby forced out of the FI by air flow towards an exhaust.

In some embodiments, instead of inter-substrate nozzle arrays 204, or in place of one of the inter-substrate nozzle arrays 204, a vacuum port array (not shown) can be provided. Likewise, instead of, or in addition to (e.g., disposed across the carrier opening), a curtain nozzle array, a vacuum port array can be provided. A vacuum port array can include multiple suction ports or an elongated slot that serves as a suction port. Even when using a vacuum port array, it can be desirable to maintain a positive pressure within the substrate carrier by ensuring that gas enters the carrier at a higher rate than it exits.

In some embodiments, each of the four edges of the substrate carrier can be configured to include one or more of an inter-substrate nozzle array, a curtain nozzle array, and/or a vacuum nozzle array positioned in any practicable arrangement. Thus, the arrangement of inter-substrate nozzle arrays, curtain nozzle arrays, and/or vacuum nozzle arrays can be entirely configurable and is not restricted to just two vertical inter-substrate nozzle arrays and a single vertical or horizontal curtain nozzle array.

Figures 4A, 4B:
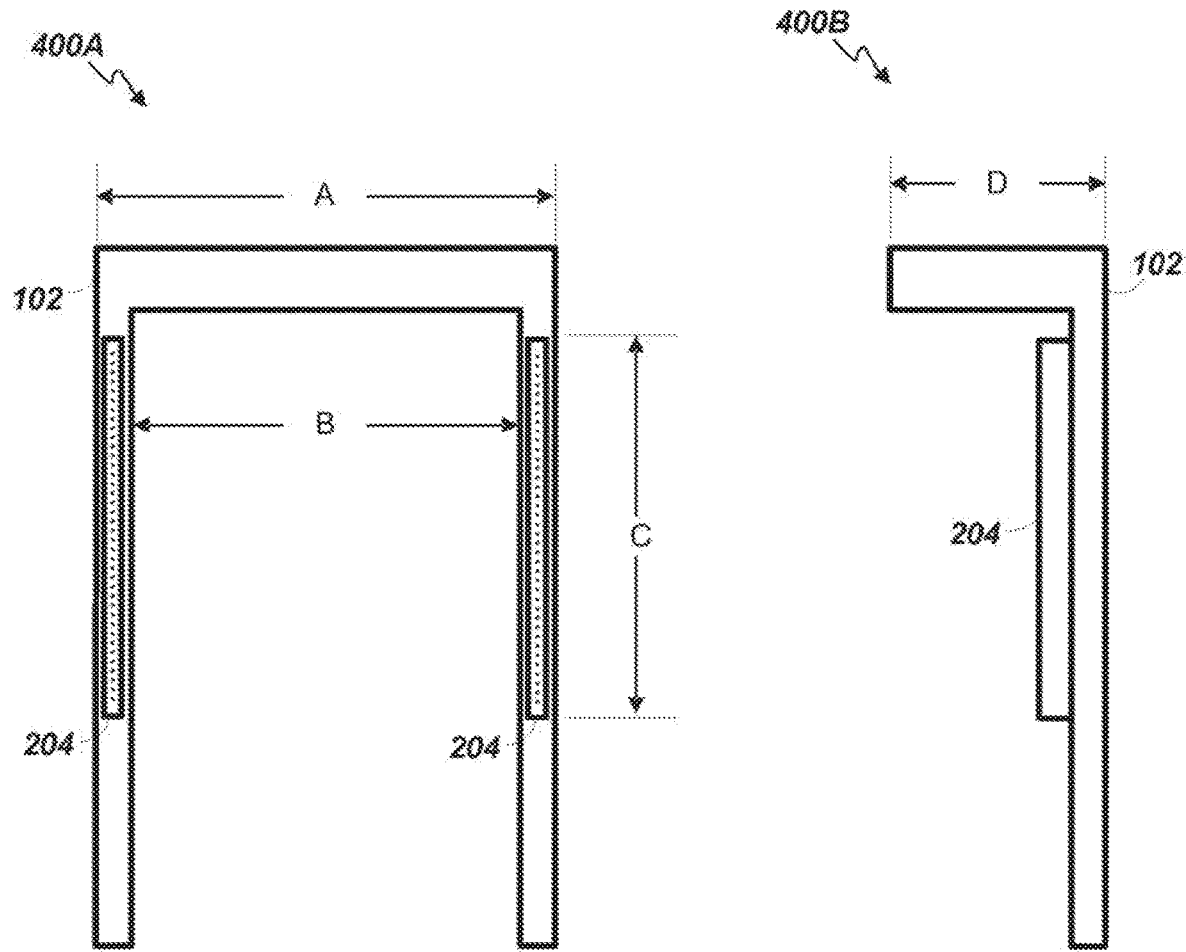
FIGS. 4A and 4B are schematic front and side views of an example frame of a substrate carrier purge system according to embodiments of the present disclosure.

FIGS. 4A and 4B indicate frame dimensions of the substrate carrier purge kit 102 that allow the kit 102 to be universally compatible with ADOs, load ports 114, and substrate carriers 112 compliant with the Semiconductor Equipment and Materials International (SEMI®) trade association's E62 standard. FIG. 4A depicts a front view 400A of the frame of the kit 102. The overall outer dimension A is in the range of approximately 400 mm to approximately 440 mm; the inner dimension B is in the range of approximately 360 mm to approximately 400 mm; and the nozzle array height dimension C corresponding to the carrier door opening is in the range of approximately 250 mm to approximately 300 mm FIG. 4B depicts a side view 400B of the frame of the kit 102. The overall depth dimension D of the kit 102 is less than approximately 100 mm. The SEMI E62 standard is for 300 mm substrates. Other dimensions practicable for different standards can be used. For example, the SEMI E154 standard defines dimensions for 450 mm substrates and a substrate carrier purge kit 102 can be configured to work with devices compliant with the E154 standard. In other words, the kit 102 of embodiments of the current disclosure can be configured to be compatible with all SEMI compliant load ports, ADOs and substrate carriers.

Figure 5A:
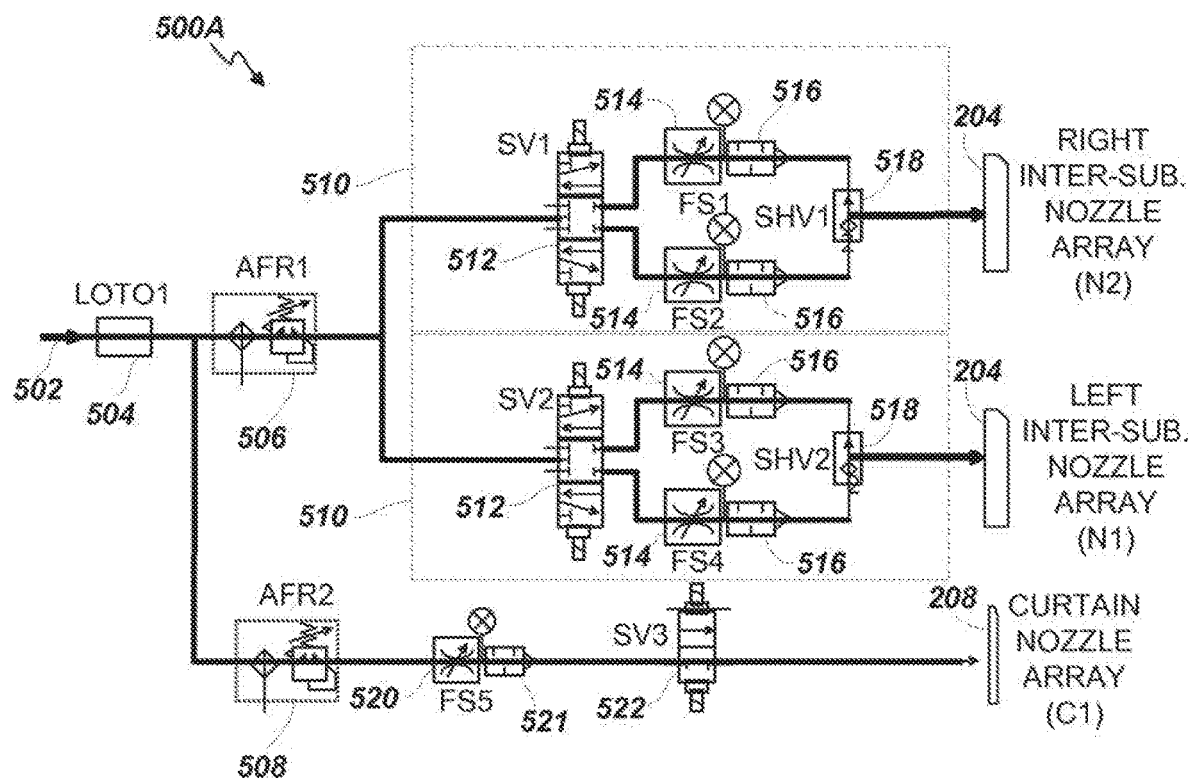
FIG. 5A is a schematic pneumatic circuit diagram depicting a first example gas flow control circuit of a substrate carrier purge system according to embodiments of the present disclosure.

Turning now to FIG. 5A, a schematic diagram depicting an example of a gas flow control pneumatic circuit 500A for a substrate carrier purge system 100 is shown. A pressurized inert gas supply 502 (e.g., nitrogen, argon, etc.) is coupled to a supply valve 504 (e.g., a lock-out tag-out (LOTO valve)) whose output is coupled to a first air filter regulator 506 (AFR1) for the inter-substrate nozzle arrays 204 and a second air filter regulator 508 (AFR2) for the curtain nozzle array 208. The first air filter regulator 506 and the second air filter regulator 508 control the proportion of source gas pressure delivered to the inter-substrate nozzle arrays 204 versus the curtain nozzle array 208.

The flow from the first air filter regulator 506 is split between two parallel sub-circuits 510 for the two inter-substrate nozzle arrays 204. The two sub-circuits 510 can each include the same components. For example, the sub-circuits can each include a valve 512 (e.g., a solenoid valve) for turning the respective inter-substrate nozzle array 204 on or off. Coupled to the output of the valve 512, the sub-circuits 510 each also include two flow switches 514 in parallel with each other and each flow switch 514 is coupled in series with a different flow restrictor 516 that are each settable to allow different flow rates. Coupled to the outputs of the flow restrictors 516, the sub-circuits 510 each also include a shuttle valve 518 that allows selection between flows from the two different flow switches 514. Thus, each of the sub-circuits 510 allows selection between three different flow states: (1) off, (2) a first flow rate (e.g., "high"), and (3) a second flow rate (e.g., "low"). The output of the sub-circuits 510 are coupled to the gas supply channel 310 of the respective inter-substrate nozzle array 204. For example, in some embodiments, one sub-circuit 510 is coupled to the inter-substrate nozzle array 204 on the right-hand side of the substrate carrier purge kit 102 and the other sub-circuit 510 is coupled to the inter-substrate nozzle array 204 on the left-hand side.

The flow from the second air filter regulator 508 is fed to a flow switch 520 in series with a flow restrictor 521 together used to set the flow rate of the gas to the curtain nozzle array 208. The output of the flow restrictor 521 is coupled to the input of a valve 522 (e.g., a solenoid valve) for turning the curtain nozzle array 208 on or off. The output of the valve 522 is coupled to the input of the curtain nozzle array 208.

Figure 5B:
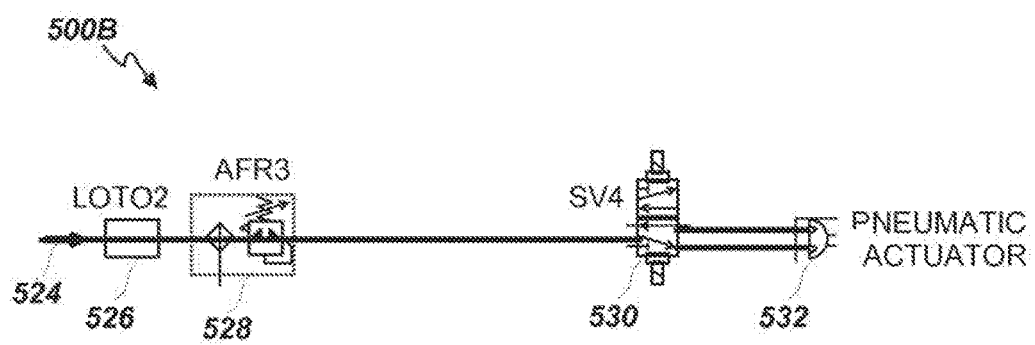
FIG. 5B is a schematic pneumatic circuit diagram depicting a first example optional actuator circuit of a substrate carrier purge system according to embodiments of the present disclosure.

In embodiments where the angle of the inter-substrate nozzle arrays 204 and/or the curtain nozzle array 208 are adjustable or dynamically adjustable (e.g., adjustable in use and/or while spraying gas) or where the arrays are adapted to oscillate, one or more pneumatic actuator circuits S00B as depicted in FIG. 5B can be used to move the arrays. The example pneumatic actuator circuit S00B shown includes a clean dry air (CDA) supply 524 coupled to a supply valve 526 (e.g., a LOTO valve) whose output is coupled to a third air filter regulator 528 (AFR3). The output of the third air filter regulator 528 is fed to the input of a valve 530 (e.g., a solenoid valve) for controlling operation of a pneumatic actuator 532 (e.g., a linear or rotatory actuator) In some embodiments, one or more pneumatic actuator circuits S00B can be used to drive motion of the inter-substrate nozzle arrays 204, the curtain nozzle array 208, an adjustable bellows in the plenum 308 of the nozzle head 304, a nozzle orifice plate 312 (FIG. 3) on the inter-substrate nozzle arrays 204 or the curtain nozzle array 208, and/or any other moveable or adjustable mechanical assemblies.

Figure 6:
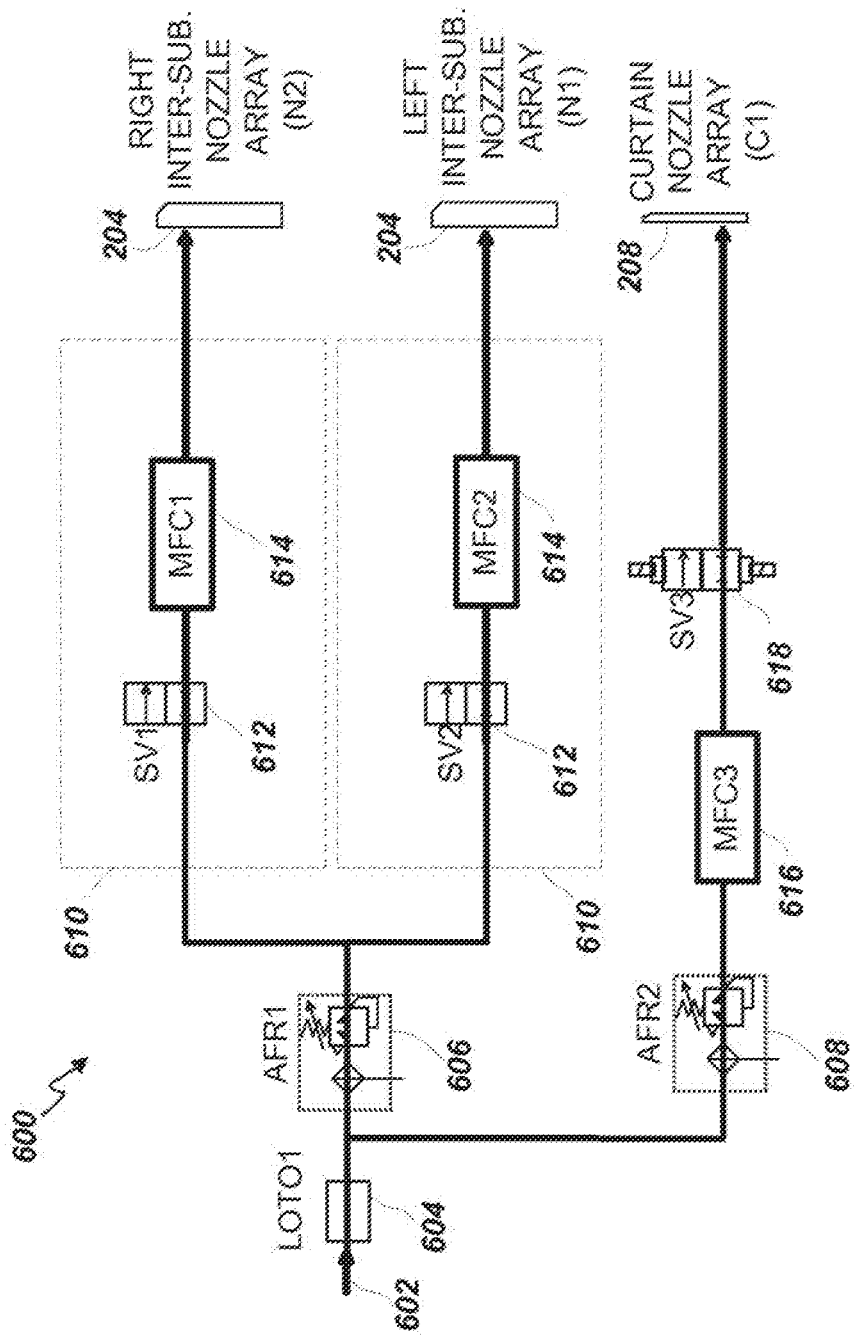
FIG. 6 is a schematic pneumatic circuit diagram depicting a second example gas flow control circuit of a substrate carrier purge system according to embodiments of the present disclosure.

FIG. 6 depicts a second example of a gas flow control pneumatic circuit 600 for a substrate carrier purge system 100. A pressurized inert gas supply 602 (e.g., nitrogen, argon, etc.) is coupled to a supply valve 604 (e.g., a LOTO valve) whose output is coupled to a first air filter regulator 606 (AFR1) for the inter-substrate nozzle arrays 204 and a second air filter regulator 608 (AFR2) for the curtain nozzle array 208. The first air filter regulator 606 and the second air filter regulator 608 control the proportion of source gas pressure delivered to the inter-substrate nozzle arrays 204 versus the curtain nozzle array 208.

The flow from the first air filter regulator 606 is split between two parallel sub-circuits 610 for the two inter-substrate nozzle arrays 204 (e.g., positioned on the left and right hand sides of the substrate carrier opening). The two sub-circuits 610 can each include the same components. For example, the sub-circuits can each include a valve 612 (e.g., a solenoid valve) for turning the respective inter-substrate nozzle array 204 on or off. Coupled to the output of the valve 612, the sub-circuits 610 can each also include a mass flow controller 614, each one coupled to one of the two inter-substrate nozzle arrays 204. Thus, the sub-circuits 610 allow selection between being off and any desired flow rate up to the maximum flow rate provided by the first air filter regulator 606. The output of the sub-circuits 610 are coupled to the gas supply channel 310 (FIG. 3) of the respective inter-substrate nozzle array 204. For example, in some embodiments, one sub-circuit 610 is coupled to the inter-substrate nozzle array 204 on the right-hand side of the substrate carrier purge kit 102 and the other sub-circuit 510 is coupled to the inter-substrate nozzle array 204 on the left-hand side.

The flow from the second air filter regulator 608 is fed to a mass flow controller 616 used to set the flow rate of the gas to the curtain nozzle array 208. The output of the mass flow controller 616 is coupled to the input of a valve 618 (e.g., a solenoid valve) for turning the curtain nozzle array 208 on or off. The output of the valve 618 is coupled to the input of the curtain nozzle array 208.

As with the gas flow control pneumatic circuit 500A of FIG. 5, the gas flow control pneumatic circuit 600 of FIG. 6 can also optionally include one or more pneumatic actuator circuits S00B as depicted in FIG. 5B for controlling operation of a pneumatic actuator 532 (e.g., a linear or rotatory actuator). As indicated above, in some embodiments, one or more pneumatic actuator circuits S00B can be used to drive motion of the inter-substrate nozzle arrays 204, the curtain nozzle array 208, an adjustable bellows in the plenum 308 of the nozzle head 304 (FIG. 3), a nozzle orifice plate 312 (FIG. 3) on the inter-substrate nozzle arrays 204 or the curtain nozzle array 208, and/or any other moveable or adjustable mechanical assemblies.

Figure 7:
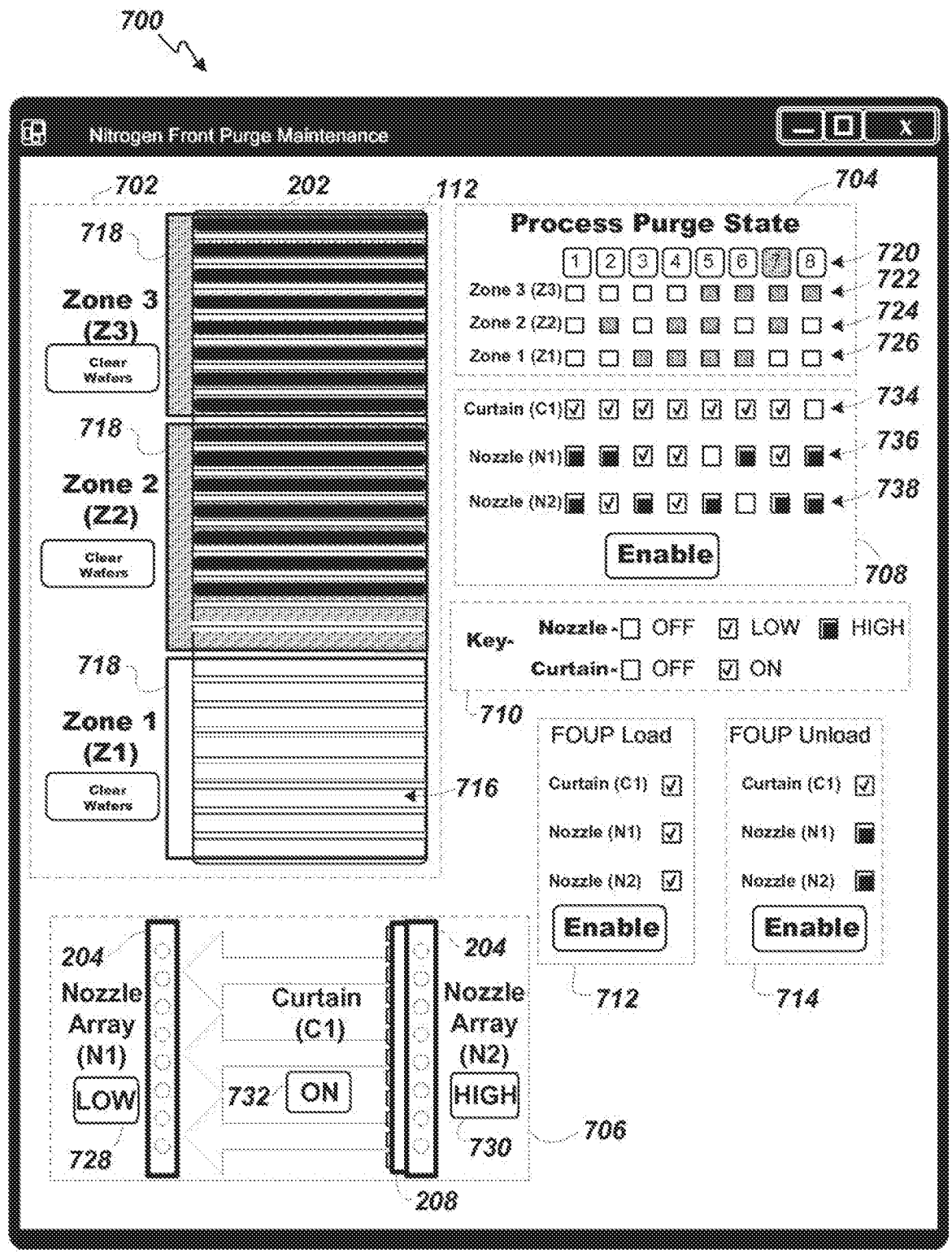
FIG. 7 is a screenshot depicting an example of a control interface of a substrate carrier purge system according to embodiments of the present disclosure.

Turning now to FIG. 7, a screenshot window of an example control interface 700 for a substrate carrier purge system 100 is depicted. Although many different control interfaces can be used, the following example interface is described in detail to illustrate operational features of the system 100. The control interface 700 can include several display/control areas that provide process status and/or configuration controls. The example display/control areas shown in FIG. 7 are each enclosed in a separate dashed line rectangle. For example, the example control interface 700 includes a substrate carrier status area 702, a process purge state display area 704, a nozzle array status area 706, a nozzle array configuration control area 708, a key display area 710, a carrier load nozzle array control area 712, and a carrier unload nozzle array control area 714. Additional or fewer display/control areas can be used.

The substrate carrier status area 702 includes a representation of a substrate carrier 112 that includes a number of substrate slots 716 grouped into logical zones 718. Each slot can hold one substrate 202 and the number of slots per zone and the number of zones per carrier can be configured by a user. For example, in the particular configuration depicted in FIG. 7, the carrier 112 includes three zones 718, Zone 1 which is empty of substrates 202, includes 8 slots 716, Zone 2 which has seven substrates 202, includes 9 slots 716 (two are empty), and Zone 3 which is full of substrates 202, includes eight slots 716. Note that the representation of the substrate carrier 112 can be modified to reflect any size carrier (with the appropriate number of slots) used with the system 100.

In another example, each zone 718 can include only one slot 716 and the carrier 112 can have 25 zones 718. In yet another example, a carrier 112 can have only one zone 718. Once the substrate carrier 112 is mapped, the substrates 202 present in the carrier 112 can be represented in the substrate carrier status area 702. Each time a substrate 202 is removed from the carrier 112 for processing or returned to the carrier 112 from processing, the substrate carrier status area 702 is updated. Thus, the substrate carrier status area 702 serves as a current map of the substrates 202 in the carrier 112.

In operation, each Zone 718 is checked for at least one substrate 202 being present. If a substrate 202 is present then the zone status will be set to TRUE. If no substrates 202 are present then respective zone status will be set FALSE. This is done for each respective Zone 718. In the particular example shown, there can be a combination of eight process purge states 704 possible from the three Zones 718. Each additional zone 718 would increase the number of possible process purge state 704 combinations based on the following formula: $n=2^Y$ where n represents the number of possible process purge states and y represents the number of zones. Thus two zones 718 would have four process purge state 704 combinations, three zones 718 have eight process purge state 704 combinations, four zones 718 would have sixteen process purge state 704 combinations, twenty-five zones 718 would yield 33,554,432 process purge state 704 combinations, etc. A "Clear Wafers" button provided for each zone 718 allows an operator to test various zone configurations in a simulation mode.

The process purge state display area 704 reflects the current purge state of the system 100 and is determined based upon which zones 718 currently have at least one substrate 202 in them. As shown in Row 720 of the process purge state display area 704, State 7 is highlighted indicating that the current process purge state is State 7. This is the case because Zone 1 is empty of substrates while Zones 2 and 3 each have at least one substrate present (note that Zones 2 and 3 are highlighted while Zone 1 is not). Row 722, Row 724 and Row 726 together provide a truth table-like representation of all the possible process purge states 1 through 8. Review of the table reveals that State 7 corresponds to the current status of the zones 718 in the carrier 112. In an illustrative example, if one substrate was to be returned to a slot 716 in Zone 1 of the carrier 112, the process purge state would change to State 5 (i.e., all zones include at least one substrate). If then all the substrates in Zones 2 and 3 were removed, leaving one substrate in Zone 1, the process purge state would change to State 3.

The nozzle array status area 706 indicates the current status of the inter-substrate nozzle arrays 204 and the curtain nozzle array 208. The status of the arrays is determined based upon the configuration defined in the nozzle array configuration control area 708 (described below) based upon the current process purge state indicated in the process purge state display area 704. In this example configuration (e.g., FIG. 5A), the inter-substrate nozzle arrays 204 are tri-state meaning they can be off, low, or high and the curtain nozzle array 208 is bi-state meaning it is either on or off. The current state of the inter-substrate nozzle array 204 on the left (N1) is indicated by the status indicia 728, the current state of the inter-substrate nozzle array 204 on the right (N2) is indicated by the status indicia 730, and the current state of the curtain nozzle array 208 in the center (C1) is indicated by the status indicia 732. To illustrate the example shown, currently while the system 100 in in process purge State 7 as indicated in the process purge state display area 704, Row 720, N1 is LOW, N2 is HIGH, and C1 is ON.

The current status of the arrays indicated in the nozzle array status area 706 is dictated by the nozzle array configuration control area 708 and the current process purge state. The nozzle array configuration control area 708 includes a curtain nozzle array row 734 that defines the desired state for each process purge state, a left inter-substrate nozzle array (N1) row 736 that defines the desired state for each process purge state, and a right inter-substrate nozzle array (N2) row 738 that defines the desired state for each process purge state. Each input box on each row allows selection of the desired status for the particular row's array for each process purge state (i.e., each column).

The various statuses available for each type of array are indicated in the key display area 710 and correspond to the hardware configuration of the gas flow control pneumatic circuit 500A (FIG. 5). As shown, inter-substrate nozzle arrays can be configured to be OFF (indicated by an empty input box), LOW (indicated by a checked input box), and HIGH (indicated by a filled input box). Curtain nozzle arrays can be configured to be OFF (indicated by an empty input box) and ON (indicated by a checked input box). Alternative symbols and arrangements can be used.

In addition to the eight process purge states defined in the process purge state display area 704 based on the absence or presence of at least one substrate in each zone, two additional purge states can be defined based upon the presence of an end effector of the FI robot in the substrate carrier. During a substrate carrier load operation, an end effector with a substrate enters the carrier, places the substrate into a slot, and then the empty end effector withdraws. During a substrate carrier unload operation, an empty end effector enters the carrier, picks up a substrate from a slot, and then the end effector holding the substrate withdraws from the carrier.

The carrier load nozzle array control area 712 defines the configuration status of the curtain nozzle array 208 and the inter-substrate nozzle arrays 204 during the substrate carrier load process. The carrier unload nozzle array control area 714 defines the configuration status of the curtain nozzle array 208 and the inter-substrate nozzle arrays 204 during the substrate carrier load process. In both the carrier load nozzle array control area 712 and the carrier unload nozzle array control area 714, the same symbols used in the key display area 710 can be used.

An additional configuration control that can be included in both the carrier load nozzle array control area 712 and the carrier unload nozzle array control area 714 is an end effector-type indicator. For example, in some embodiments, end effectors that include a clamping mechanism for securely holding a substrate can be used. In other embodiments, end effectors that do not clamp the substrates can be used. If the substrate is not secured to the end effector with a clamping mechanism, a user may not want to risk having the substrate dislodged from the end effector by a gas flow from one or more of the arrays. Thus, an end effector-type indicator can be used to override the configuration in the carrier load nozzle array control area 712 or in the carrier unload nozzle array control area 714 if a non-clamping end effector blade is used.

In some embodiments, an additional display/control area can be provided to control operation of the pneumatic actuator circuits S00B (FIG. 5B) to control additional configuration options such as motion of the inter-substrate nozzle arrays 204, the curtain nozzle array 208, an adjustable bellows in the plenum 308 of the nozzle head 304, a nozzle orifice plate 312 (FIG. 3) on the inter-substrate nozzle arrays 204 or the curtain nozzle array 208, and/or any other moveable or adjustable mechanical assemblies.

In embodiments where the gas flow control pneumatic circuit 600 with mass flow controllers 614 is used, instead of simple tri- or bi-state status input options, parameter values that specify actual flow rates can be entered into the input boxes of the curtain nozzle array row 734, the left inter-substrate nozzle array (N1) row 736, and the right inter-substrate nozzle array (N2) row 738 of the nozzle array configuration control area 708. The gas flow control pneumatic circuit 600 can be controlled in response to the entered parameter values. Likewise, the input boxes in the carrier load nozzle array control area 712 and the carrier unload nozzle array control area 714 can be adapted to receive parameter values that specify actual flow rates to control the gas flows from the nozzle arrays. In some embodiments, alternative gases can be selected using an additional control input in the nozzle array configuration control area 708.

Figure 8:
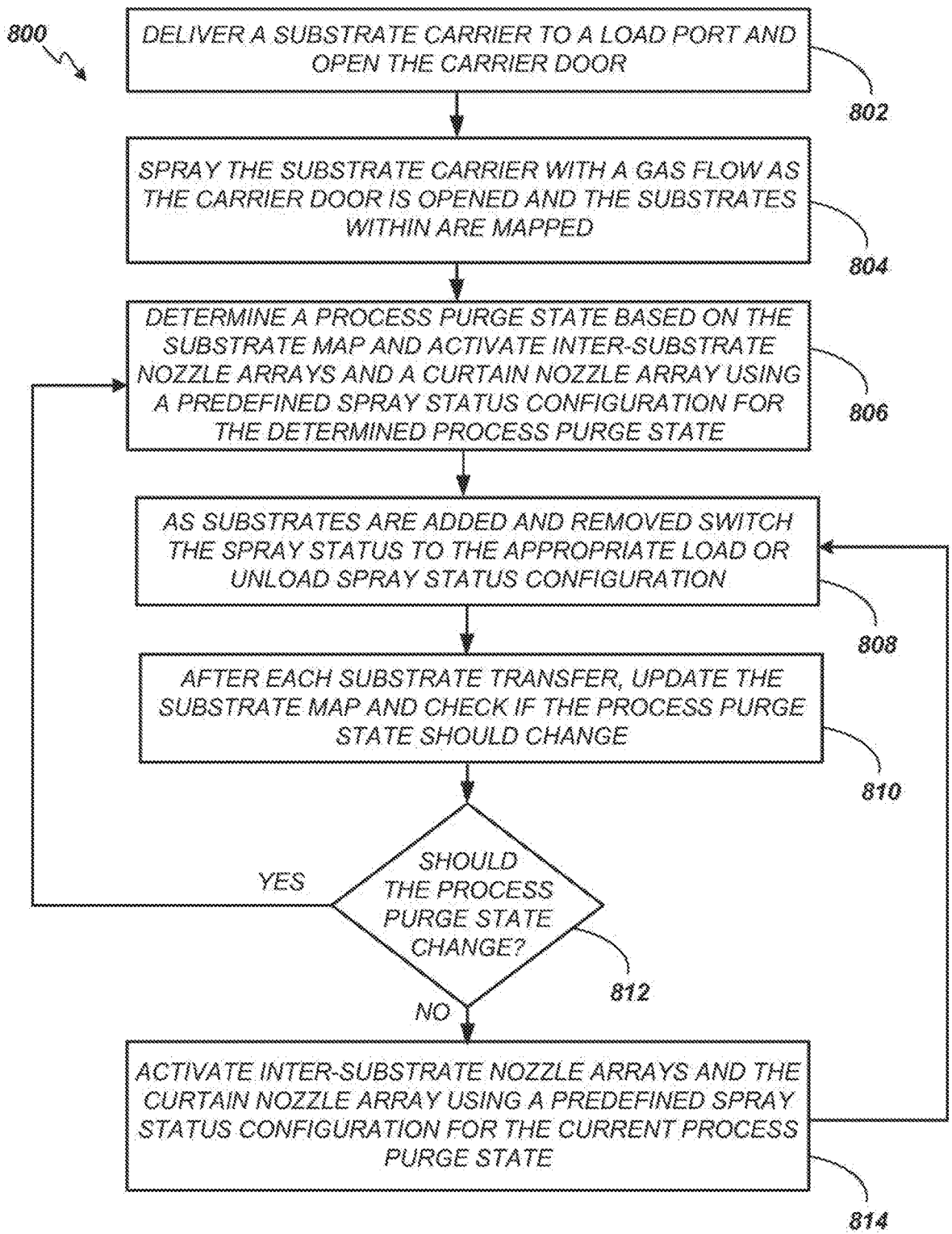
FIG. 8 is a flowchart illustrating an example method of purging a substrate carrier at a factory interface according to embodiments of the present disclosure.

Turning now to FIG. 8, a flow chart depicting an example method 800 of operating a substrate carrier purge system 100 according to embodiments of the present disclosure is provided. A substrate carrier is placed on a load port and the carrier door is opened (802). In some embodiments, a carrier door opening and mapping state can be defined wherein nozzle arrays spray a gas flow at the carrier as the carrier door is opened and the substrates within are mapped (804). Once the door is opened, the substrates within the carrier are mapped to determine or confirm the number and location of substrates actually in the carrier. Once the substrates are mapped, the system 100 determines the process purge state based on the substrate map and activates the inter-substrate nozzle arrays and the curtain nozzle array based upon the predefined configuration for the determined process purge state (806).

As substrates 202 are moved out of and into the substrate carrier 112 by the FI robot, the system 100 changes to the appropriate pre-defined spray status configuration specified in either the carrier load nozzle array control area 712 or the carrier unload nozzle array control area 714 (808). After each pick or place, the map is updated (810) and the system 100 determines if the process purge state should be changed (812). If so, a new process purge state is determined and the statuses of the nozzle arrays are changed according to the new state (806). If not, the nozzle arrays flow the gas according to the current process purge state (814).

The method repeats until all substrates have been processed and/or the substrate carrier is to be sealed and removed. In some embodiments, a carrier door closing state can be defined wherein nozzle arrays spray a gas flow at the carrier as the carrier door is closed.

Numerous embodiments are described in this disclosure, and are presented for illustrative purposes only. The described embodiments are not, and are not intended to be, limiting in any sense. The presently disclosed inventive concepts are widely applicable to numerous embodiments, as is readily apparent from the disclosure. One of ordinary skill in the art will recognize that the disclosed embodiments may be practiced with various modifications and alterations, such as structural, logical, software, and electrical modifications. Although particular features of the disclosed embodiments of the disclosures may be described with reference to one or more particular embodiments and/or drawings, it should be understood that such features are not limited to usage in the one or more particular embodiments or drawings with reference to which they are described, unless expressly specified otherwise.

The present disclosure is neither a literal description of all embodiments nor a listing of features of embodiments of the disclosure that must be present in all embodiments.

The Title (set forth at the beginning of the first page of this disclosure) is not to be taken as limiting in any way as the scope of the disclosed disclosure(s).

The term "product" means any machine, manufacture and/or composition of matter as contemplated by 35 U.S.C. § 101, unless expressly specified otherwise.

When a single device, component or article is described herein, more than one device, component or article (whether or not they cooperate) may alternatively be used in place of the single device, component or article that is described. Accordingly, the functionality that is described as being possessed by a device may alternatively be possessed by more than one device, component or article (whether or not they cooperate).

Similarly, where more than one device, component or article is described herein (whether or not they cooperate), a single device, component or article may alternatively be used in place of the more than one device, component or article that is described. For example, a plurality of computer-based devices may be substituted with a single computer-based device. Accordingly, the various functionality that is described as being possessed by more than one device, component or article may alternatively be possessed by a single device, component or article.

The functionality and/or the features of a single device that is described may be alternatively embodied by one or more other devices that are described but are not explicitly described as having such functionality and/or features. Thus, other embodiments need not include the described device itself, but rather can include the one or more other devices which would, in those other embodiments, have such functionality/features.

Devices that are in communication with each other need not be in continuous communication with each other, unless expressly specified otherwise. On the contrary, such devices need only transmit to each other as necessary or desirable, and may actually refrain from exchanging data most of the time. For example, a machine in communication with another machine via the Internet may not transmit data to the other machine for weeks at a time. In addition, devices that are in communication with each other may communicate directly or indirectly through one or more intermediaries.

A description of an embodiment with several components or features does not imply that all or even any of such components and/or features are required. On the contrary, a variety of optional components are described to illustrate the wide variety of possible embodiments of the present disclosure(s). Unless otherwise specified explicitly, no component and/or feature is essential or required.

Further, although process steps, algorithms or the like may be described in a sequential order, such processes may be configured to work in different orders. In other words, any sequence or order of steps that may be explicitly described does not necessarily indicate a requirement that the steps be performed in that order. The steps of processes described herein may be performed in any order practical. Further, some steps may be performed simultaneously or concurrently despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to the disclosure, and does not imply that the illustrated process is preferred.

"Determining" something can be performed in a variety of manners and therefore the term "determining" (and like terms) includes calculating, computing, deriving, looking up (e.g., in a table, database or data structure), ascertaining, recognizing, and the like.

A "display" as that term is used herein is an area that conveys information to a viewer. The information may be dynamic, in which case, an LCD, LED, CRT, Digital Light Processing (DLP), rear projection, front projection, or the like may be used to form the display. The aspect ratio of the display may be 4:3, 16:9, or the like. Furthermore, the resolution of the display may be any appropriate resolution such as 480i, 480p, 720p, 1080i, 1080p or the like. The format of information sent to the display may be any appropriate format such as Standard Definition Television (SDTV), Enhanced Definition TV (EDTV), High Definition TV (HDTV), or the like. The information may likewise be static, in which case, painted glass may be used to form the display. Note that static information may be presented on a display capable of displaying dynamic information if desired. Some displays may be interactive and may include touch screen features or associated keypads as is well understood.

The present disclosure may refer to a "control system," interface, or program. A control system, interface, or program, as that term is used herein, may be a computer processor coupled with an operating system, device drivers, and appropriate programs (collectively "software") with instructions to provide the functionality described for the control system. The software is stored in an associated memory device (sometimes referred to as a computer readable medium). While it is contemplated that an appropriately programmed general purpose computer or computing device may be used, it is also contemplated that hard-wired circuitry or custom hardware (e.g., an application specific integrated circuit (ASIC)) may be used in place of, or in combination with, software instructions for implementation of the processes of various embodiments. Thus, embodiments are not limited to any specific combination of hardware and software.

A "processor" means any one or more microprocessors, Central Processing Unit (CPU) devices, computing devices, microcontrollers, digital signal processors, or like devices. Exemplary processors are the INTEL PENTIUM or AMD ATHLON processors.

The term "computer-readable medium" refers to any statutory medium that participates in providing data (e.g., instructions) that may be read by a computer, a processor or a like device. Such a medium may take many forms, including but not limited to non-volatile media, volatile media, and specific statutory types of transmission media. Non-volatile media include, for example, optical or magnetic disks and other persistent memory. Volatile media include DRAM, which typically constitutes the main memory. Statutory types of transmission media include coaxial cables, copper wire and fiber optics, including the wires that comprise a system bus coupled to the processor.

Common forms of computer-readable media include, for example, a floppy disk, a flexible disk, hard disk, magnetic tape, any other magnetic medium, a CD-ROM, Digital Video Disc (DVD), any other optical medium, punch cards, paper tape, any other physical medium with patterns of holes, a RAM, a PROM, an EPROM, a FLASH-EEPROM, a USB memory stick, a dongle, any other memory chip or cartridge, a carrier wave, or any other medium from which a computer can read. The terms "computer-readable memory" and/or "tangible media" specifically exclude signals, waves, and wave forms or other intangible or non-transitory media that may nevertheless be readable by a computer.

Various forms of computer readable media may be involved in carrying sequences of instructions to a processor. For example, sequences of instruction (i) may be delivered from RAM to a processor, (ii) may be carried over a wireless transmission medium, and/or (iii) may be formatted according to numerous formats, standards or protocols. For a more exhaustive list of protocols, the term "network" is defined below and includes many exemplary protocols that are also applicable here.

It will be readily apparent that the various methods and algorithms described herein may be implemented by a control system and/or the instructions of the software may be designed to carry out the processes of the present disclosure.

Where databases are described, it will be understood by one of ordinary skill in the art that (i) alternative database structures to those described may be readily employed, and (ii) other memory structures besides databases may be readily employed. Any illustrations or descriptions of any sample databases presented herein are illustrative arrangements for stored representations of information. Any number of other arrangements may be employed besides those suggested by, e.g., tables illustrated in drawings or elsewhere. Similarly, any illustrated entries of the databases represent exemplary information only; one of ordinary skill in the art will understand that the number and content of the entries can be different from those described herein. Further, despite any depiction of the databases as tables, other formats (including relational databases, object-based models, hierarchical electronic file structures, and/or distributed databases) could be used to store and manipulate the data types described herein. Likewise, object methods or behaviors of a database can be used to implement various processes, such as those described herein. In addition, the databases may, in a known manner, be stored locally or remotely from a device that accesses data in such a database. Furthermore, while unified databases may be contemplated, it is also possible that the databases may be distributed and/or duplicated amongst a variety of devices.

As used herein a "network" is an environment wherein one or more computing devices may communicate with one another. Such devices may communicate directly or indirectly, via a wired or wireless medium such as the Internet, LAN, WAN or Ethernet (or IEEE 802.3), Token Ring, or via any appropriate communications means or combination of communications means. Exemplary protocols include but are not limited to: Bluetooth™, Time Division Multiple Access (TDMA), Code Division Multiple Access (CDMA), Global System for Mobile communications (GSM), Enhanced Data rates for GSM Evolution (EDGE), General Packet Radio Service (GPRS), Wideband CDMA (WCDMA), Advanced Mobile Phone System (AMPS), Digital AMPS (D-AMPS), IEEE 802.11 (WI-FI), IEEE 802.3, SAP, the best of breed (BOB), system to system (S2S), or the like. Note that if video signals or large files are being sent over the network, a broadband network may be used to alleviate delays associated with the transfer of such large files, however, such is not strictly required. Each of the devices is adapted to communicate on such a communication means. Any number and type of machines may be in communication via the network. Where the network is the Internet, communications over the Internet may be through a website maintained by a computer on a remote server or over an online data network including commercial online service providers, bulletin board systems, and the like. In yet other embodiments, the devices may communicate with one another over RF, cable TV, satellite links, and the like. Where appropriate encryption or other security measures such as logins and passwords may be provided to protect proprietary or confidential information.

It will be readily apparent that the various methods and algorithms described herein may be implemented by, e.g., appropriately programmed general purpose computers and computing devices. Typically a processor (e.g., one or more microprocessors) will receive instructions from a memory or like device, and execute those instructions, thereby performing one or more processes defined by those instructions. Further, programs that implement such methods and algorithms may be stored and transmitted using a variety of media (e.g., computer readable media) in a number of manners. In some embodiments, hard-wired circuitry or custom hardware may be used in place of, or in combination with, software instructions for implementation of the processes of various embodiments. Thus, embodiments are not limited to any specific combination of hardware and software. Accordingly, a description of a process likewise describes at least one apparatus for performing the process, and likewise describes at least one computer-readable medium and/or memory for performing the process. The apparatus that performs the process can include components and devices (e.g., a processor, input and output devices) appropriate to perform the process. A computer-readable medium can store program elements appropriate to perform the method.

The present disclosure provides, to one of ordinary skill in the art, an enabling description of several embodiments and/or disclosures. Some of these embodiments and/or disclosures may not be claimed in the present application, but may nevertheless be claimed in one or more continuing applications that claim the benefit of priority of the present application.

The foregoing description discloses only example embodiments of the disclosure. Modifications of the above-disclosed apparatus, systems and methods which fall within the scope of the disclosure will be readily apparent to those of ordinary skill in the art.

Accordingly, while the present disclosure has been disclosed in connection with exemplary embodiments thereof, it should be understood that other embodiments may fall within the spirit and scope of the disclosure, as defined by the following claims.

What is claimed is:

1. A method of purging a substrate carrier at a load port, the method comprising:
   opening a door of a substrate carrier that is delivered to a load port;
   spraying the substrate carrier with a gas flow responsive to the opening the door;
   mapping substrates within the substrate carrier to generate a substrate map;
   determining a process purge state based on the substrate map; and
   activating one or more inter-substrate nozzle arrays and one or more curtain nozzle arrays using a predefined spray status configuration for the process purge state.

2. The method of claim 1, further comprising:
   switching the predefined spray status configuration to a load spray status configuration as substrates are added to the substrate carrier;
   updating the substrate map as substrates are added to the substrate carrier, to generate an updated substrate map; and
   determining a new process purge state based on the updated substrate map.

3. The method of claim 1, further comprising:
   switching the predefined spray status configuration to an unload spray status configuration as substrates are removed from the substrate carrier;
   updating the substrate map as substrates are removed from the substrate carrier, to generate an updated substrate map; and
   determining a new process purge state based on the updated substrate map.

4. The method of claim 3, wherein activating the one or more inter-substrate nozzle arrays and the one or more curtain nozzle arrays comprises using a second predefined spray status configuration for the new process purge state.

5. The method of claim 1, wherein activating the one or more inter-substrate nozzle arrays comprises spraying gas into the substrate carrier between substrates within the substrate carrier.

6. The method of claim 1, wherein activating the one or more curtain nozzle arrays comprises spraying gas across an opening of the substrate carrier.

7. The method of claim 1, wherein activating the one or more curtain nozzle arrays comprises spraying gas vertically across an opening of the substrate carrier from a curtain nozzle array disposed horizontally across a top side of an opening of the substrate carrier.

8. The method of claim 1, wherein activating the one or more inter-substrate nozzle arrays comprises dynamically adjusting, during spraying, an angle of the one or more inter-substrate nozzle arrays with respect to sides of the substrate carrier.

9. The method of claim 8, wherein the angle ranges between zero and 45 degrees.

10. A method of purging a substrate carrier at a load port, the method comprising:
    opening a door of a substrate carrier that is delivered to a load port;
    spraying the substrate carrier with a gas flow responsive to the opening the door;
    determining a process purge state depending on a number and location of substrates positioned within one or more zones of the substrate carrier; and
    activating one or more inter-substrate nozzle arrays and one or more curtain nozzle arrays using a predefined spray status configuration for the process purge state.

11. The method of claim 10, wherein activating the one or more inter-substrate nozzle arrays comprises dynamically adjusting, during spraying, an angle of the one or more inter-substrate nozzle arrays with respect to sides of the substrate carrier.

12. The method of claim 10, wherein activating the one or more inter-substrate nozzle arrays comprises:

adjusting a first rate of spray of a first inter-substrate nozzle array aimed relative to a first side of the substrate carrier; and adjusting a second rate of spray of a second inter-substrate nozzle array aimed relative to a second side of the substrate carrier.

13. The method of claim 12, wherein the first rate of spray is different from the second rate of spray.

14. The method of claim 12, wherein activating the one or more curtain nozzle arrays comprises spraying gas from a first curtain nozzle array at a third rate of spray that is different from the first rate of spray and the second rate of spray.

15. A method of purging a substrate carrier at a load port, the method comprising:

opening a door of a substrate carrier that is delivered to a load port;

spraying the substrate carrier with a gas flow responsive to the opening the door;

mapping substrates within one or more zones of the substrate carrier to generate a substrate map;

determining a process purge state based on the substrate map and based on one of presence or absence of an end effector of a factory interface robot within the substrate carrier; and activating one or more inter-substrate nozzle arrays and one or more curtain nozzle arrays using a predefined spray status configuration for the process purge state.

16. The method of claim 15, wherein activating the one or more inter-substrate nozzle arrays comprises dynamically adjusting, during spraying, an angle of the one or more inter-substrate nozzle arrays with respect to sides of the substrate carrier.

17. The method of claim 15, further comprising:

switching the predefined spray status configuration to a load spray status configuration as substrates are added to the substrate carrier;

updating the substrate map as substrates are added to the substrate carrier, to generate an updated substrate map; and determining a new process purge state based on the updated substrate map.

18. The method of claim 17, wherein activating the one or more inter-substrate nozzle arrays and the one or more curtain nozzle arrays comprises using a second predefined spray status configuration for the new process purge state.

19. The method of claim 15, further comprising:

switching the predefined spray status configuration to an unload spray status configuration as substrates are removed from the substrate carrier;

updating the substrate map as substrates are removed from the substrate carrier, to generate an updated substrate map; and determining a new process purge state based on the updated substrate map.

20. The method of claim 15, wherein activating the one or more inter-substrate nozzle arrays comprises:

adjusting a first rate of spray of a first inter-substrate nozzle array aimed relative to a first side of the substrate carrier;

adjusting a second rate of spray of a second inter-substrate nozzle array aimed relative to a second side of the substrate carrier; and wherein activating the one or more curtain nozzle arrays comprises spraying gas from a first curtain nozzle array at a third rate of spray different from the first rate of spray and the second rate of spray.

* * * * *